United States Patent [19]

Menon et al.

[11] Patent Number: 5,258,984

[45] Date of Patent: Nov. 2, 1993

[54] METHOD AND MEANS FOR DISTRIBUTED SPARING IN DASD ARRAYS

[75] Inventors: Jaishankar M. Menon; Richard L. Mattson; Spencer W. Ng, all of San Jose, Calif.

[73] Assignee: International Business Machines Corporation, Armonk, N.Y.

[21] Appl. No.: 714,969

[22] Filed: Jun. 13, 1991

[51] Int. Cl.⁵ ............................................... G06F 11/20
[52] U.S. Cl. .................................... 371/10.1; 371/10.2
[58] Field of Search .................... 371/10.1, 10.2, 11.1; 395/575; 364/268.5, 269.2

[56] References Cited

U.S. PATENT DOCUMENTS 5,195,100  3/1993  Katz et al. ........................... 371/10.1
5,208,813  5/1993  Stallmo ................................ 371/10.1

Primary Examiner—Vincent P. Canney
Attorney, Agent, or Firm—R. Bruce Brodie

[57] ABSTRACT

A method and means in which data and parity blocks forming parity groups together with spare blocks are distributed over array block locations according to at least one combinatorial design, each group having N data and P parity blocks. The combinatorial designs yield uniform or balanced loading thereby minimizing the number of accesses to reconstruct missing data and parity blocks and their copyback into spare block locations, and, minimize the number of accesses to the reconstructed data referenced subsequent to its copyback. Distributions of the spare block capacity of one or two DASDs are shown over single and multiple arrays and shared among multiple arrays. Parity block distribution although ancillary to spare distribution enhances throughput and reduces the number of accesses for rebuild etc.

24 Claims, 8 Drawing Sheets

4+P array with one spare

| 1 | 2 | 3 | 4 | 5 | 6 |
|---|---|---|---|---|---|
| d1 | d1 | d1 | d1 | p1 | (s1) |
| d2 | d2 | d2 | p2 | (s2) | d2 |
| d3 | d3 | p3 | (s3) | d3 | d3 |
| d4 | p4 | (s4) | d4 | d4 | d4 |
| p5 | (s5) | d5 | d5 | d5 | d5 |
| (s6) | d6 | d6 | d6 | d6 | p6 |

ON FAILURE:
  Read 4 regions from each of 5 DASDs
  Write 1 region to each of 5 DASDs
  Total # of I/Os = 25

| 1 | 2 | 3 | 4 | 5 | 6 |
|---|---|---|---|---|---|
| d1 | d1 | d1 | d1 | p1 | (d1) |
| d2 | d2 | d2 | p2 | (d2) | d2 |
| d3 | d3 | p3 | (p3) | d3 | d3 |
| d4 | p4 | (d4) | d4 | d4 | d4 |
| p5 | (d5) | d5 | d5 | d5 | d5 |
| (d6) | d6 | d6 | d6 | d6 | p6 |

Figure 2: Distributed Sparing

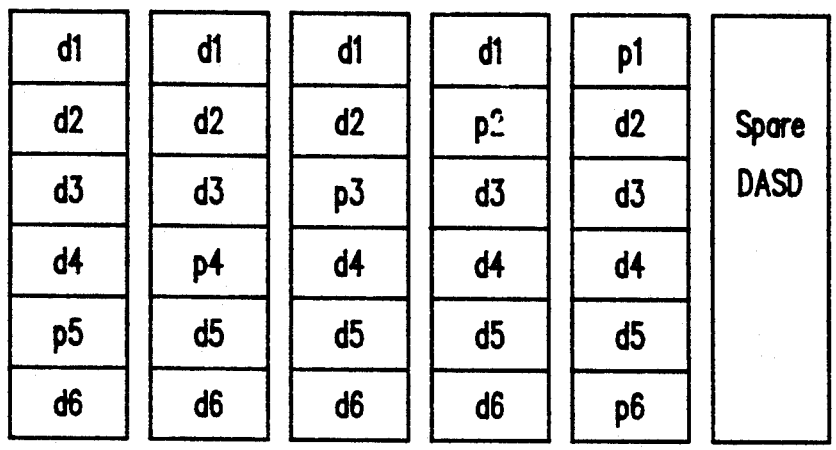
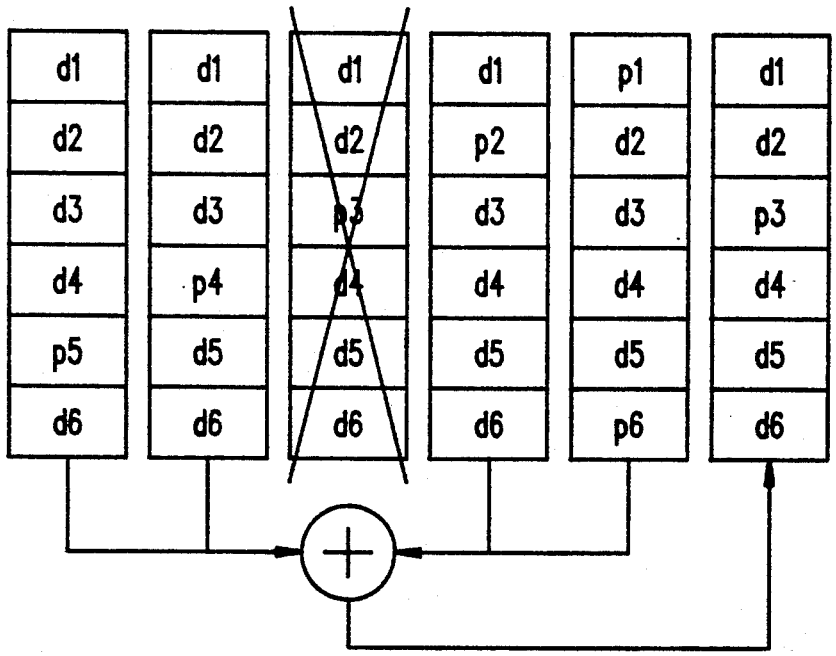
Figure 1: Traditional Sparing

4+P array with one spare

| 1 | 2 | 3 | 4 | 5 | 6 |
|---|---|---|---|---|---|
| d1 | d1 | d1 | d1 | p1 | (s1) |
| d2 | d2 | d2 | p2 | (s2) | d2 |
| d3 | d3 | p3 | (s3) | d3 | d3 |
| d4 | p4 | (s4) | d4 | d4 | d4 |
| p5 | (s5) | d5 | d5 | d5 | d5 |
| (s6) | d6 | d6 | d6 | d6 | p6 |

ON FAILURE:
    Read 4 regions from each of 5 DASDs
    Write 1 region to each of 5 DASDs
    Total # of I/Os = 25

| 1 | 2 | 3 | 4 | 5 | 6 |
|---|---|---|---|---|---|
| d1 | d1 | d1 | d1 | p1 | (d1) |
| d2 | d2 | d2 | p2 | (d2) | d2 |
| d3 | d3 | p3 | (p3) | d3 | d3 |
| d4 | p4 | (s4) | d4 | d4 | d4 |
| p5 | (d5) | d5 | d5 | d5 | d5 |
| (d6) | d6 | d6 | d6 | d6 | p6 |

Figure 2: Distributed Sparing

3+P array with two spares

| 1 | 2 | 3 | 4 | 5 | 6 |
|---|---|---|---|---|---|
| d1 | d1 | d1 | p1 | (s1) | (s1) |
| d2 | d2 | p2 | (s2) | (s2) | d2 |
| d3 | p3 | (s3) | (s3) | d3 | d3 |
| p4 | (s4) | (s4) | d4 | d4 | d4 |
| (s5) | (s5) | d5 | d5 | d5 | p5 |
| (s6) | d6 | d6 | d6 | p6 | (s6) |

Figure 3: Distributed Sparing With 2 Spares Per Array

Array 1

| 1 | 2 | 3 | 4 | 5 | 6 |
|---|---|---|---|---|---|
| d1 | d1 | d1 | d1 | p1 | (s1) |
| d2 | d2 | d2 | p2 | (s2) | d2 |
| d3 | d3 | p3 | (s3) | d3 | d3 |
| d4 | p4 | (s4) | d4 | d4 | d4 |
| p5 | (s5) | d5 | d5 | d5 | d5 |
| (s6) | d6 | d6 | d6 | d6 | p6 |

Array 2

| 1 | 2 | 3 | 4 | 5 | 6 |
|---|---|---|---|---|---|
| d1 | d1 | d1 | d1 | p1 | (s1) |
| d2 | d2 | d2 | p2 | (s2) | d2 |
| d3 | d3 | p3 | (s3) | d3 | d3 |
| d4 | p4 | (s4) | d4 | d4 | d4 |
| p5 | (s5) | d5 | d5 | d5 | d5 |
| (s6) | d6 | d6 | d6 | d6 | p6 |

Figure 4: Two Arrays With Distributed Sparing

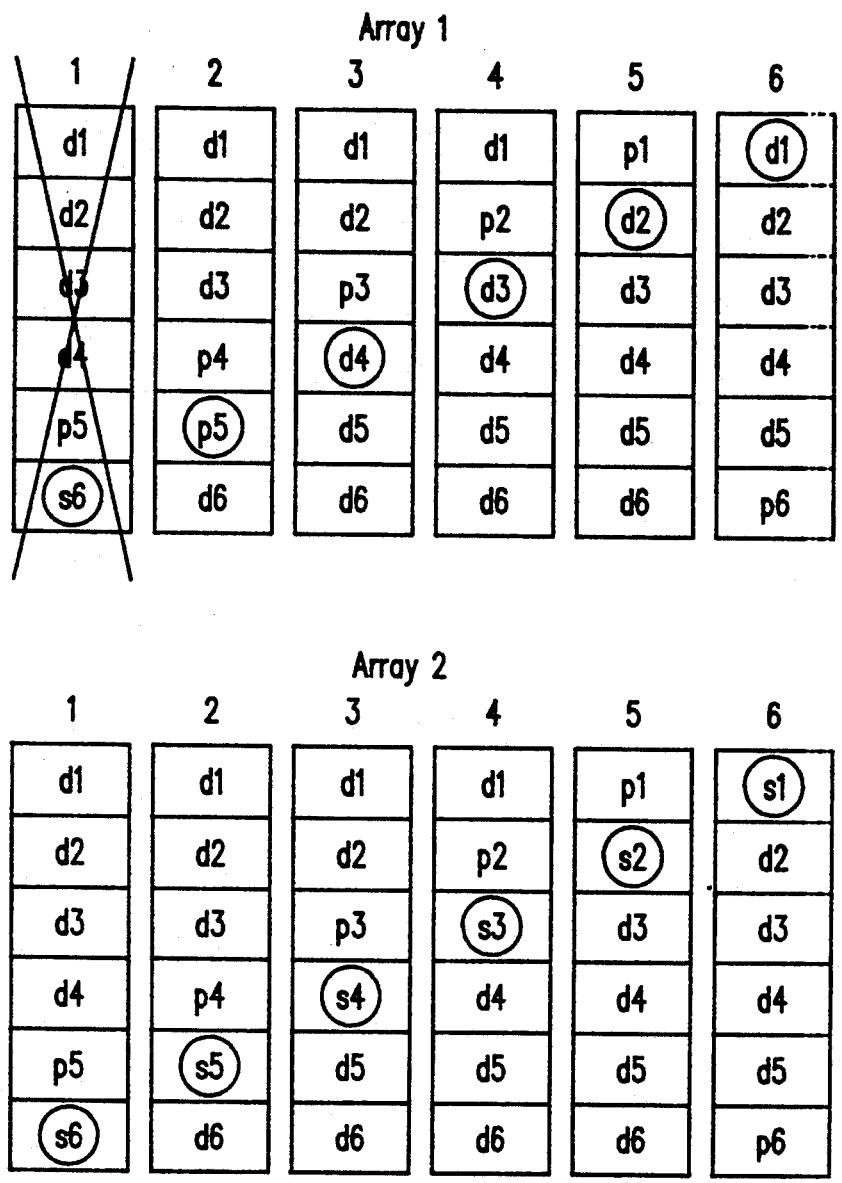
Figure 5: Distributed Sparing Situation After One DASD Fails

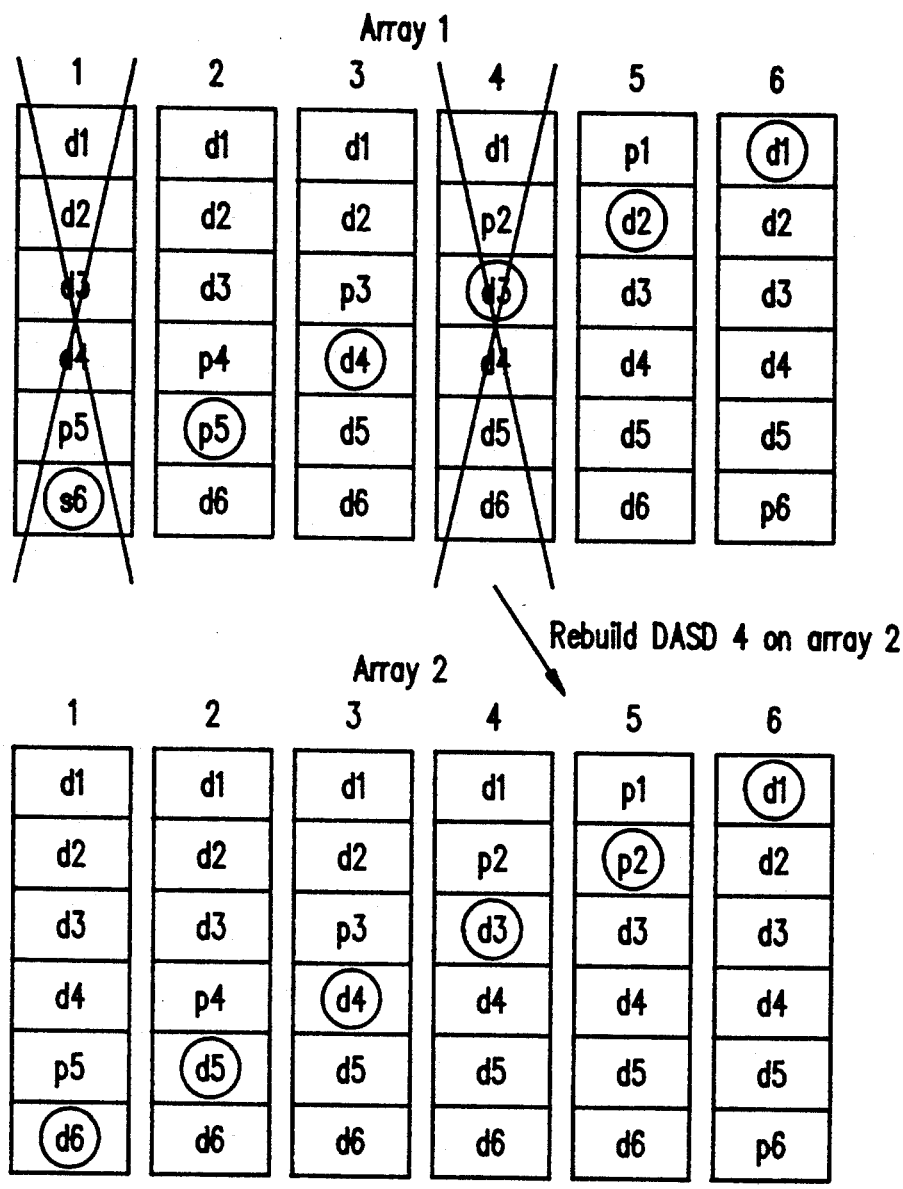
Figure 6: Distributed Sparing Situation After Two DASDs Fail

Figure 7: Partially Distributed Sparing

SYNCHRONOUS DASD ARRAY

METHOD AND MEANS FOR DISTRIBUTED SPARING IN DASD ARRAYS

FIELD OF THE INVENTION

This invention relates to DASD storage subsystems, and more particularly, to methods and means for managing spare DASD array capacity so as to optimize array operations in fault tolerant, degraded, and data rebuild modes.

DESCRIPTION OF RELATED ART

Arrays, Effect of Redundancy, Reading and Writing

In the prior art, it is known to read and write data+-parity (as defined over the data) from and to a synchronous array of N data+P parity DASDs. The DASD array arrangement increases the data rate by N* rate of a single DASD and increases logical track size by N* single DASD track length. Reference can be made to Patterson et al, "A Case For Redundant Arrays Of Inexpensive Disks (RAID)", Report No. UCB/CSD 87/391, December 1987, Computer Science Division, U. of California, Berkeley.

It is also known that writing a data string to a DASD array includes segmenting data into N blocks (termed striping), determining parity over the blocks, and storing the N data+P parity blocks at a synchronous address on counterpart failure independent DASDs. Likewise, reading a data string from an array involves copying N+P addressed blocks from a synchronous address on counterpart DASDs into a buffer, concatenating them, checking parity, and serially transporting the concatenated blocks (string) from the buffer to the accessing CPU.

DASD Failure and MTBF

It is well recognized that aggregating DASDs into arrays does not improve the mean time between DASD failure. Rather, it decreases it. However, the combined use of redundant information (parity), dynamic substitution of formatted spare DASDs for failed ones, and reconstruction of missing data onto the substituted spare, substantially increases the mean time between data unavailability by at least orders of magnitude. This is described in Park et al, "Providing Fault Tolerance In Parallel Secondary Storage Systems", Princeton University Report CS-TR-057-86, November 1986 and Dunphy et al, U.S. Pat. No. 4,914,656, "Disk Drive Memory", issued Apr. 3, 1990.

Two Usages of Parity Groups

The term "parity group" has acquired data oriented and storage oriented usages.

In the data usage, "parity group" signifies a predetermined number of logically associated data blocks+ a parity or equivalent redundant information defined over or derived from the data blocks. In the storage usage, "parity group" signifies a predetermined number of logically associated physical storage locations whose data contents determine the value of the redundant information.

Parity Spreading and DASD Arrays

The copending Mattson and Ng application, U.S. Ser. No. 07/562,188, filed Aug. 3, 1990 (IBM Refine. SA9-90-020), "Method and Means for Managing DASD Array Accesses When Operating In Degraded Mode", uses parity group as a logical association of data blocks as applied to Patterson's RAID 5 type DASD array. In Mattson, the data and storage boundaries of the parity group were not necessarily coextensive. The only limitation was that no two segmented blocks from the same data parity group be written onto the same DASD.

In contrast, Dunphy et al, U.S. Pat. No. 4,914,656, "Disk Drive Memory", issued Apr. 3, 1990, defines parity over data as in Mattson. However, in Dunphy the storage boundaries are the same as that of the data parity group. They are maintained even in the presence of failure since a spare DASD substitutes for the failed DASD and missing data is rebuilt and rewritten onto the substituted spare.

Clark et al, U.S. Pat. No. 4,761,785, "Parity Spreading Enhanced Storage Access", issued Aug. 2, 1988 discloses a non-synchronous DASD storage subsystem in which parity groups are defined over a range of storage and where data boundaries are NOT necessarily coextensive with storage boundaries.

In Clark et al, each data string is written into consecutive locations of a "storage" parity group. If the data string size exceeds the capacity of the group, then the residue of the data string is written into another "storage" parity group. If the data string is smaller than the group, then the remaining space may well be occupied by other data strings. Parity is taken across information occypying logically associated extents (range of address locations) of the DASDs forming the group.

Distributed Parity and Virtual or Distributed Sparing

Clark et al also taught that the location of the parity blocks for counterpart storage parity groups could be distributed across DASDs in the subsystem with the only limitation that not all of the blocks be written on a single DASD. This was contrary to Ouchi, U.S. Pat. No. 4,092,732, "System for Recovering Data Stored In A Failed Memory Unit", issued May 30, 1978, and Dunphy et al where parity is written to dedicated DASDs.

Copending patent application, Bond et al, U.S. Ser. No. 07/542,216, filed Jun. 21, 1990, "Method and Apparatus for Recovering Parity Protected Data", (IBM ref. no. RO9-89-029) teaches the use of a virtual spare among non-synchronous DASDs where parity groups are defined across storage, and data and storage boundaries are not necessarily coextensive.

In Bond et al, the CPU can read and write to a logical spare DASD. The logical addresses are then distributed in non-specific manner across one or more real DASDs. More particularly, Bond teaches that the locations of parity blocks distributed as in Clark may be overwritten as if they were spare locations in the reconstruction of data being accessed after a DASD has failed. Usually, this means the parity block of the parity group covering the lost data. Bond extends this notion to the use of other spare or nonessential locations among the DASDs.

Array Performance Limitations Using Bond et al Type Distributed Sparing

In a Bond et al type of distributed sparing via writing reconstructed data into the group parity location, once recovery is complete, the system operates without parity. This is inimical to a highly available, fault-tolerant system.

Alternatively, Bond et al reserves spare blocks on different DASDs. When a DASD fails, data is recreated and written onto spare blocks on surviving DASDs. What Bond did not recognize was that:

a. two or more data blocks from the same storage parity group are written on the same DASD. If a DASD were to fail now, the DASD array subsystem would lose data, which is unacceptable.

b. data blocks of the same group formerly located on different DASDs now being resident upon the same DASD cannot be read in parallel.

c. lowered throughput because of resource sharing among competitive processes occasioned by DASD arm stealing between the reading of the surviving data blocks to compute any missing data or parity block and the writing of a reconstructed data or parity block.

SUMMARY OF THE INVENTION

It is an object of this invention to devise a method and means for facilitating reconstruction of missing data and parity blocks and copying them back into spare block DASD locations.

It is a related object to devise a method and means in which the data and parity blocks forming parity groups together with spare blocks are distributed over array block locations according to at least one combinatorial design, each group having N data and P parity blocks.

Additionally, it is yet another object that said combinatorial designs minimize the number of accesses to reconstruct missing data and parity blocks and their copyback into spare block locations.

It yet another object that the throughput be maximized during reconstruction and copyback of missing data or parity blocks and subsequent reference thereto.

Further, said method and means should be readily extensible to storage subsystems addressing two or more failure independent DASD arrays. Also, said method and means should be extensible such that the combinatorial design should be distributable over multiple failure independent arrays and with regard to different sparing ratios or fractions.

The foregoing objects are satisfied by a method and means for rebuilding portions of parity groups resident on a failed DASD, in a storage subsystem having a plurality of DASDS and where each DASD stores K blocks. Also, each parity group includes N data, P parity, and S spare blocks.

The method and means include configuring an array of $N+P+S$ DASDs. Next, K parity groups are distributed in synchronous array addresses across subsets of the $N+P+S$ DASDs such that no two blocks from the same parity group reside on the same DASD. $K*S$ blocks constituting spare storage are distributed across the array such that each DASD includes $K*S/(N+P+S)$ spare blocks thereon. Furthermore, no more than S spare storage blocks nor more than P parity blocks are stored on the same synchronous array address or on the same DASD.

In the event of a single DASD failure, for each of the $(K-(K*S/(N+P+S)))$ affected parity groups, $N+P+S-2$ blocks belonging to the group are logically combined (XOR'ed) from the other $N+P+S-2$ other DASDs into a single block. Each single block is written into a counterpart one of the remaining $K*S*(N+P+S-1)/(N+P+S)$ spare blocks such that no two blocks of the same parity group are distributed on the same DASD.

In a first embodiment (where $P=1$, $S=1$), the method and means include configuring an array of $N+2$ DASDs. The next step involves distributing $K-K/(N+2)$ parity groups in synchronous array addresses across subsets of $N+1$ DASDs of the array such that no two blocks from the same parity group reside on the same DASD. Concurrently, K blocks as spare storage are distributed across the array such that each DASD includes $K/(N+2)$ spare blocks thereon. As in the general case, no more than one spare storage block nor more than one parity block are stored on the same synchronous array address or on the same DASD.

In the event of a single DASD failure, for each $K-K/(N+2)$ parity groups, N blocks belonging to the group are logically combined from N other DASDs into a single block. Each single block is written into a counterpart one of the remaining $K*(N+1)/(N+2)$ spare blocks such that no two blocks of the same parity group are distributed on the same DASD.

In another embodiment (where $P=1$, $S=2$), $2*K$ blocks of spare storage and $(K-2*K/(N+3))$ parity blocks are distributed such that no more than two spare storage blocks nor more than one parity block are stored on the same synchronous array address nor on the same DASD. This permits rebuilding and writing missing data to a first series of spare blocks after a first DASD has failed and repeating the process in the rarer event that a second DASD should fail.

The method and apparatus of this invention are extensible to storage subsystems having multiple failure independent DASD arrays. Where multiple DASD failures occur in the same array, the missing data is first rebuilt on the spare space of the first array and the remaining missing data rebuilt on the spare space of the second array.

Where storage subsystem expansion involves one array with distributed spare capacity and an array without a spare, such capacity may be conveniently shared. Also, the blocks representing the capacity of one or more spare DASDs can be distributed across multiple arrays so that no synchronous address or DASD has more than one such spare block increment. Next, the parity groups can be written across their respective arrays in a rotated or block offset manner. This would permit a uniform sharing.

Other distributions of parity groups and sparing are disclosed which permit storage subsystem DASD array expansion while maintaining a sparing fraction or ratio objective.

BRIEF DESCRIPTION OF THE DRAWING

FIG. 1 shows parity groups coextensive with storage bounds using dedicated parity and spare DASDs and reconstruction of missing data or parity onto the spare DASD according to the prior art.

FIG. 2 depicts distributing K parity groups $\{(4+P)<(N+2)\}$ and K spare spaces over an array of $N+2$ DASDs of capacity K blocks or spaces/DASD permitting recovery from a single DASD failure according to the invention, no two elements of the same group nor space being located on the same DASD.

FIG. 3 also sets out a distribution of K parity groups $\{(3+P)<(N+2)\}$ and 2K spare spaces over an array of $N+2$ DASDs of capacity K blocks/DASD permitting recovery of up to two DASD failures according to the invention, no two elements of the same group nor spare space being located on the same DASD.

FIG. 4 illustrates two DASD arrays with distributed sparing.

FIGS. 5 and 6 show failure of one or more DASDs in a first one of two arrays and the rebuilding of missing data on the distributed spare spaces across both arrays.

FIG. 7 depicts partially distributed sparing.

DESCRIPTION OF THE PREFERRED EMBODIMENT

DASD Array Architecture

Figure 8:
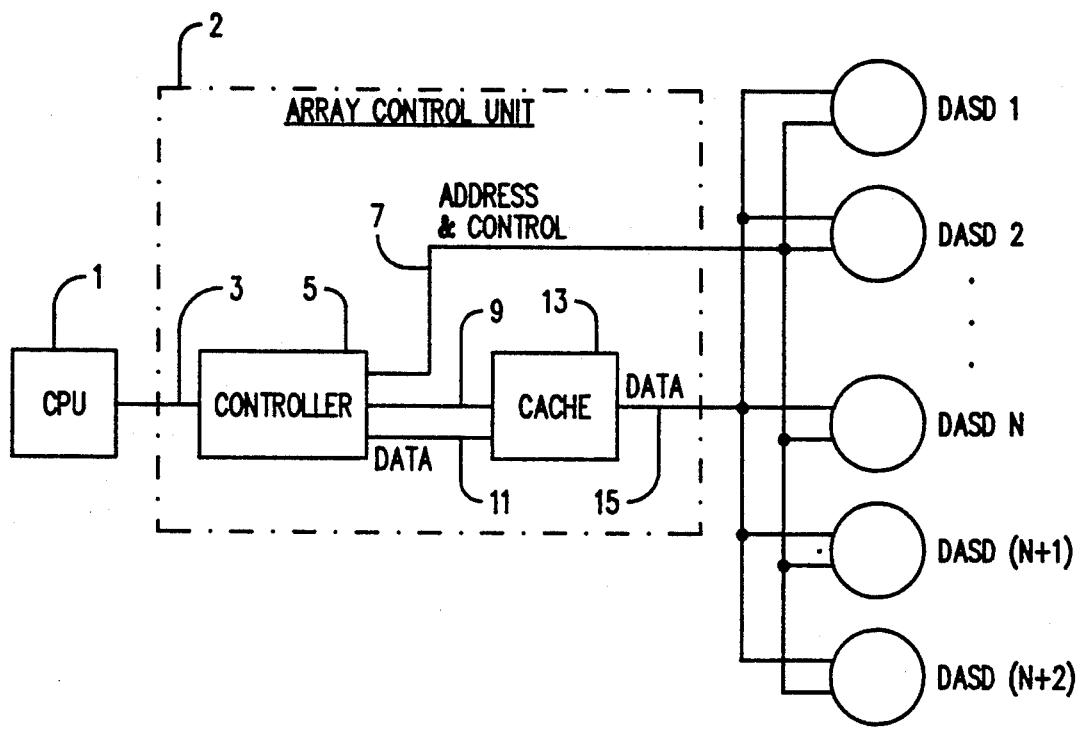
FIG. 8 depicts a synchronous array of N+2 DASDs attached to a CPU by way of an array control unit.

Referring now to FIG. 8, there is shown CPU 1 accessing DASDs 1 through N+2 over a path including channel 3, array controller 5, and cache 13. Controller 5 operatively secures synchronism and accesses among any N+1 at a time of the N+2 DASDs i.e. DASD 1 through DASD N+2 over control path 7.

N+1 streams of data defining a predetermined number of consecutive bytes can be exchanged in parallel to cable 13 over data path 15. The N+1 streams of data may all be responsive to a single access (synchronous operation). Also, this invention is operative where each of the N+1 streams may be responsive different accesses (asynchronous operations). Likewise, data can be exchanged serially by byte between CPU 1 and controller 5 over path 3 after a parallel to serial conversion in controller 5 in the read direction and a serial to parallel conversion in the write direction.

In the read direction, data is supplied from cache 13 to controller 5 via data paths 9 and 11. In the write direction, data is moved from the controller 5 to the cache 3 over paths 9 and 11.

PARITY, DASD FAILURE AND SPARING, AND ROBUSTNESS

DASD arrays use parity to protect against single DASD failures. If a DASD fails, data that used to be on that DASD can be reconstructed, as needed, using the data and parity on the surviving DASDs. This is illustrated in Table 1 in a DASD array of five DASDs. In this diagram, Pi is a parity block that protects the four data blocks labelled Di. Such a DASD array is called a 4+P array, since there is one parity block for every four data blocks.

TABLE 1

| DASD 1 | D1 | D2 | D3 | D4 | P5 |
| DASD 2 | D1 | D2 | D3 | P4 | D5 |
| DASD 3 | D1 | D2 | P3 | D4 | D5 |
| DASD 4 | D1 | P2 | D3 | D4 | D5 |
| DASD 5 | P1 | D2 | D3 | D4 | D5 |

Only one track (consisting of five blocks) is shown from each of the DASDs. P1 contains the parity or exclusive OR of the blocks labeled D1 on all the data DASDs. Similarly, P2 is the exclusive OR of the blocks labeled D2 on all the DASDs, and so on. It should be noted that the parity blocks are distributed amongst all the drives to balance the workload.

Such a DASD array is robust against single DASD failures. If DASD 1 were to fail, data on it can be recreated by reading data and parity from the remaining four DASDs and performing the appropriate exclusive OR operations.

An array is said to enter "degraded mode" when a DASD in the array fails, because the performance and reliability of the array becomes degraded. Performance is degraded since every DASD access to a block on the failed DASD now requires DASD accesses to other DASDs in the array for reconstructing the block that is no longer accessible. Reliability is degraded, since if a second DASD fails before the failed DASD is replaced and the data on it reconstructed, the array will lose data.

In the specification of this invention, the term "reliability" indicates the degree of immunity from data loss it possesses. The higher the immunity from data loss, or the higher the mean time to data loss (MTTDL), the higher the reliability of the array.

To minimize the probability of losing data and the length of time the array operates with degraded performance, arrays sometimes use "hot spare" DASDs that are an integral part of the array. The spare DASD(s) is (are) unused during normal operations. On a DASD failure, the data that used to be on the failed DASD is rebuilt to a spare DASD. The array is said to leave degraded mode operation and re-enter normal mode operation (sometimes called "fault tolerant mode") as soon as the data on the failed DASD has been rebuilt to a spare DASD.

Traditional Sparing

Referring now to FIG. 1, there is shown an array in which parity groups are coextensive with storage bounds. The array uses dedicated parity and spare DASDs in aid of reconstruction of missing data or parity onto the spare DASD according to the prior art.

The array in FIG. 1 comprises N+2 DASDs (for N=4). One of the DASDs is a spare DASD that is unused in normal operation and the remaining 5 DASDs operate as a 4+P array. This is termed "dedicated sparing". Each of the remaining N+1 (5) DASDs is divided into some number K of blocks or block locations. This is called a "parity group" which consists of N data and one parity block, i.e. one block from each of N+1 DASDs. The array then can store K parity groups, each with N+1 blocks or block locations.

In this invention and the prior art such as Dunphy et al, all logically related N+1 blocks of data and parity are one to one mapped into N+1 blocks of addressible storage. Consequently, the distinction between data and storage oriented parity groups disappears.

If data in any block location is lost, it can be reconstructed from the remaining N block locations of that parity group. When a DASD fails, K block locations from K different parity groups are lost. Each lost block location can be rebuilt using the corresponding block locations from the surviving DASDs. The rebuilt data is written to the spare DASD.

Referring again to FIG. 1, a failed DASD is shown as being crossed out. The reconstruction of the data contents depicted as the XORing of the operative contents from the N other DASDs. In the FIG. 1 array, a DASD failure requires the array to read 6 block locations from each of four DASDs, and to write 6 blocks to the spare DASD which now replaces the failed DASD. That is, a total of 30 DASD I/Os are needed to complete the rebuild.

Traditional sparing suffers two disadvantages. First, it does not utilize the spare DASDs in normal operation. Second, the non-use of the spare DASD raises a doubt as to its operability when needed as a substitute for a failed DASD.

The second drawback could be overcome if the array controller were to periodically read and write data to various tracks of the spare DASDs in order to verify their correct operation.

Distributed Sparing

Referring now to FIG. 2, there is shown distributed sparing and distributed parity in a array comprising N+2 DASDs (N=4) as before. Some number of block locations (labelled s1 through s6) are left unused in each DASD such that the total spare space on all the DASDs is equal to the capacity of a single DASD. Thus, this method leaves the same amount of spare space as current methods that use a dedicated spare DASD, but the spare space is distributed among all the DASDs rather than concentrated in a single DASD. Each parity group is extended to contain N data block, a parity block and a spare block. The data and parity block are also called "information blocks" to distinguish them from spare blocks.

As is apparent from FIG. 2, no two blocks from a parity group are on the same DASD. Therefore, if a DASD fails, at most one information block from any parity group is lost and this lost block can be rebuilt from the remaining information blocks of the parity group on the other DASDs. The lost block from a parity group is rebuilt to the spare block for that parity group which is on another DASD.

For example, if DASD 3 were to fail in FIG. 2, block d1 would be rebuilt to DASD 6, block d2 to DASD 5, block p3 to DASD 4, block d5 to DASD 2 and block d6 to DASD 1. Note that all the information blocks d4 and p4 survive the failure of DASD 3 and do not need to be rebuilt. In all, four blocks had to be read from each of 5 DASDs and one block had to be written to each of five DASDs, for a total of 25 DASD I/Os to complete the recovery process. This is better than the 30 DASD I/Os that were needed to complete a rebuild in the traditional sparing approach.

It follows that no two information blocks from a parity group end up on the same DASD following the rebuild, making it possible to tolerate another DASD failure at this point.

Distributed Sparing Performance Consequences

N+2 DASDs are used in normal mode (when no DASD has failed) as opposed to N+1 DASDs in current methods. Typical values for N are between 4 and 10. With N=4, the distributed sparing scheme uses 6 DASDs in parallel instead of 5 and potentially improves performance by 20% in normal mode. With N=10, distributed sparing could improve performance by 9% in normal mode.

When a DASD fails, the array is said to operate in degraded mode. Distributed sparing has better performance in degraded mode than traditional sparing for two reasons. First, more parallelism (N+1 DASDs used instead of N in current methods) is involved. Secondly, in distributed sparing, only $K-(K/(N+2))$ blocks are lost (as opposed to K blocks for current methods) when a DASD fails. In the earlier example, 5 blocks were lost when a DASD failed, whereas the traditional sparing approach lost 6 blocks when a DASD failed. Since accesses to lost blocks require extra accesses, the fewer blocks lost the better the overall performance.

Finally, distributed sparing has better performance during rebuild of lost data. In traditional sparing, the lost data is recovered to a single DASD which can be a bottleneck. With distributed sparing, the data is recovered in parallel to multiple DASDs so that no single DASD is a bottleneck. Furthermore, since less data is lost in this method, less data needs to be recovered. This explains why, in the example, distributed sparing only needed 25 I/Os instead of the 30 I/Os required in traditional sparing.

Distributed sparing requires $(N+1)*(K-(K/(N+2)))$ I/Os versus $(N+1)*K$ I/Os for traditional sparing. The number of I/Os needed for rebuild has been reduced by the fraction $(N+1)/(N+2)$.

As with traditional sparing, the rebuild of missing data and parity blocks preferably begins at cylinder zero of all DASDs and sweeps to the last cylinder. At the start of the sweep, the block lost from the first parity group would be rebuilt to DASD N+2; so DASD N+2 would be writing and the other DASDs would be reading. Then, for the second parity group, DASD N+1 would be writing and the other DASDs would be reading, and so on to the last parity group. Thus, in FIG. 2, DASDs 1, 2, 4 and 5 would read block 1, while DASD 6 would write block 1. Then, DASDs 1, 2, 4 and 6 would read block 2 while DASD 5 would write block 2; and so on.

Spare Distribution, Rebuild, and Arm Stealing

If distributed spare space were placed on the last few cylinders of each DASD, arm stealing would occur between the reads and writes (operations) to a DASD during rebuild. This stems from the fact that the read operations require the arms to sweep from the first cylinder on down, whereas the write operations require the arms to be at the last cylinders.

Preferably, spare space should be distributed at several different physical locations on different DASDs in order to minimize arm stealing during rebuild. However, physical address placement is involved in a trade off with other access performance factors. For instance, if all the spare space is at the extremities, then there would be less arm motion in normal operation of each drive.

Distributed Sparing Using Capacity of Multiple DASDs

Referring now to FIG. 3, there is shown an array in which the spare capacity of up to two DASDs is distributed in a uniform pattern across N+3 DASDs. That is, in an array of N+3 DASDs each having a capacity of K blocks/DASD, then 2*K blocks are distributed thereacross such that no more than two spare blocks are located on the same stripe or on the same DASD. Also, FIG. 3 depicts distribution of K*P parity blocks such that no more than a single parity block is located on the same stripe and on the same DASD.

Referring again to FIG. 3, it is apparent that an N+2 DASD array of fixed size formed where N=4 requires that a 4+P sized parity group tolerant of single DASD failures would have to be reformatted and striped on a 3+P block basis. This would provide the 2*K spare capacity which could then be uniformly distributed.

It is considered well within the scope of this invention to extend the precept to higher numbers of failures tolerances.

Distributed Sparing on Systems With Multiple Arrays

Referring now to FIGS. 4–8, there are shown distributed sparing among two or more failure independent arrays of DASDs. Multiple array configurations are significant where storage subsystem capacity is expanded incrementally. That is it well appreciated within the scope of this invention to distribute and use spare capacity among failure independent addressible DASD arrays so as to minimize both performance and cost impacts.

Storage Subsystem Expansion Where Each Array Includes One DASD Distributed Spare Capacity Referring now to FIG. 4, there are depicted two 4+P arrays each having one DASD spare capacity distributed uniformly by or within the individual array. If a DASD in an array were to fail, that DASD would be rebuilt to the spare space distributed in that same array. That is, the spare space distributed in each array is available in common. Reference may be made to Dunphy et al, where dedicated spare DASDs were reserved in common among parity groups. However, Dunphy required that a spare DASD be dynamically and automatically switched to replace the failed DASD. Such switching is nowhere required in this invention.

Referring again to FIG. 4, if DASD 1 from array 1 were to fail, followed by DASD 3 from array 2, DASD 1 would be rebuilt to spare space in array 1 and DASD 3 would be rebuilt to spare space on array 2. However, if DASD 1 from array 1 fails first; this causes it to be rebuilt to spare space in array 1. Next, if DASD 4, also from array 1 fails, then no spare space is available on array 1. In this invention, the contents of the failed DASD 4 that is the second failure should be rebuilt onto the spare space on array 2.

Referring now to FIG. 5, there is depicted the failure of DASD 1. DASD 1 originally stored one data block from each of four parity groups (d1–d4), a parity block (p5) from a fifth parity group, and a spare or unassigned block (s6). The spares (s1–s6) are assigned such that no synchronous address (the same address position across each of the DASDs in the array) has more than one spare block. The same applies to each DASD. In this aspect of the invention, DASD 1 is rebuilt such that blocks d1–d4 and p5 are determined by logically combining (XORing) the counterpart N other blocks of the parity group into a single block and writing the single block into a spare s(i) having the same synchronous address as the other blocks. Consequently, block d2 is formed by XORing the d2 blocks in the same address on DASDs 2, 3, and 6 and parity p2 on DASD 4. The rebuilt block d2 is then written in the spare position on DASD 5. This is repeated for all but the last block s6. Since s6 is a spare block, no logical combining and writing actions are required.

Referring now to FIG. 6, there is shown a second DASD failure (DASD 4) occurring in the same array (array 1) as the first failure. The sparing in both arrays is distributed such that each DASD has K/(N+2) spare blocks and and only one spare block can appear in the same synchronous address and DASD. This means that DASD 4 from array 1 can be rebuilt by logical combining the remaining N DASDs in the group into a single block and writing the block into counterpart spare blocks in array 2.

A storage subsystem can be expanded by adding one array at a time where each array comes with its own distributed spare space. A limitation of this expansion as configured is that it is not possible to have a single spare that is shared by multiple arrays. Therefore, the cost of sparing may be higher than that which can be afforded by a system or that which is appropriate for the system.

Referring again to FIG. 6, another limitation arises after the second failure, the blocks of array 1 are now scattered across 10 DASDs (4 surviving DASDs from array 1 and 6 from array 2) instead of the original 6 DASDs. Therefore, the simultaneous failure of any 2 DASDs from this group of 10 would cause data loss. In other words, as DASDs fail and are rebuilt to other arrays, the Mean-Time-To-Data-Loss (MTTDL) of the system gets somewhat worse. The MTTDL is calculated as the probability that a second DASD fails shortly after the first one has failed and before it has been rebuilt.

Storage Subsystem Expansion Where Arrays Share DASD Distributed Spare Capacity

Figure 7:
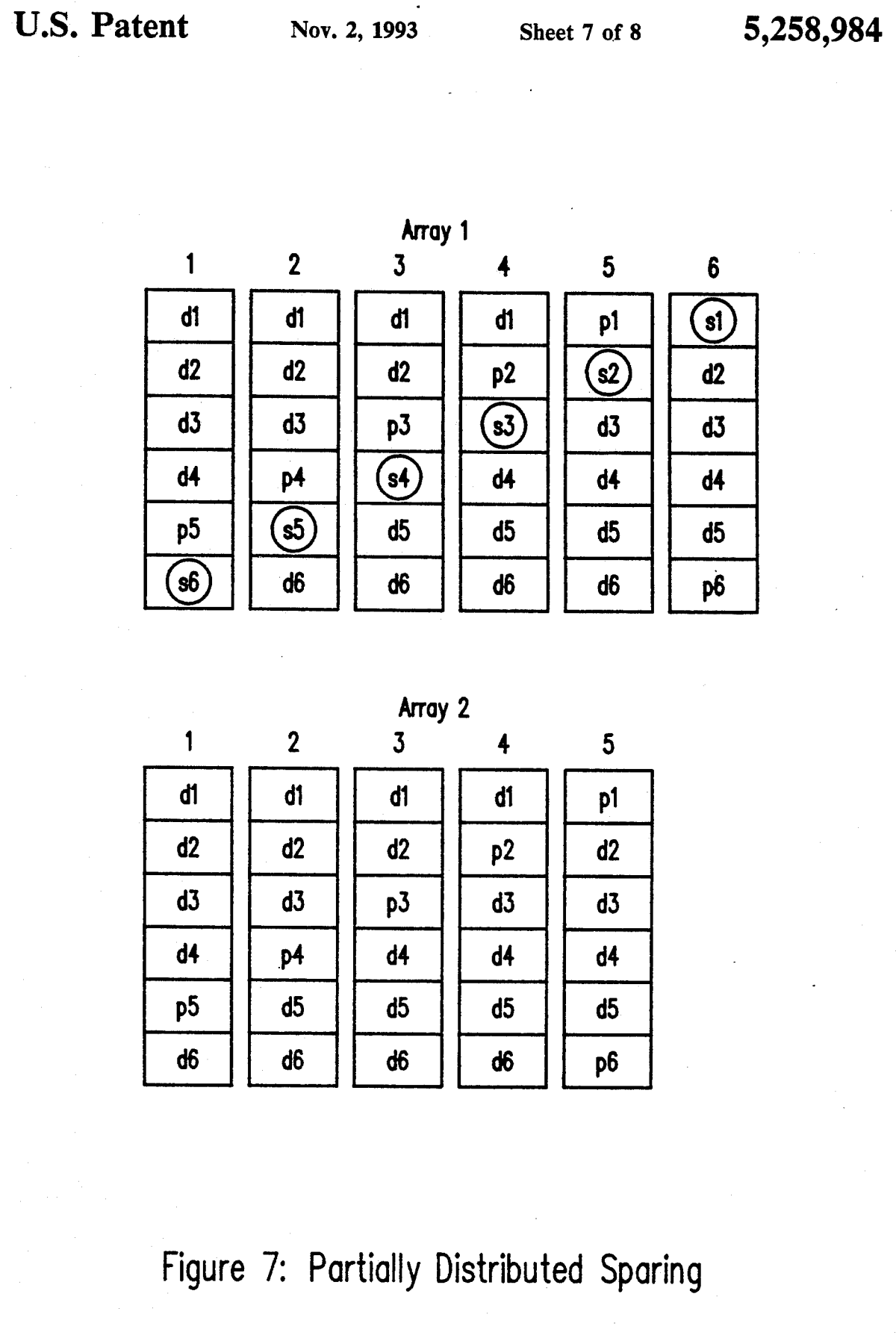

Referring now to FIG. 7, array 1 is a 4+P with distributed sparing according to the precept of the invention. However, array 2 is also 4+P but without sparing.

If a DASD in array 1 were to fail, five blocks would be lost (one of the blocks is a spare block), and there would be five spare blocks on the other five DASDs in the array to rebuild the five blocks lost. If a DASD in array 2 were to fail, 6 blocks would be lost, and there would be 6 spare blocks on the 6 DASDs in array 1 to rebuild the 6 lost blocks. In this way, the distributed spare blocks in array 1 would be available to rebuild blocks of a single failure occurring in either array.

Advantages and Limitages of Partially Distributed Sparing

Besides the advantage that such an approach allows us to share a single spare amongst multiple arrays and does not require each array to have a spare, it has the additional advantage that we can adjust the spare space requirements with system growth by allowing the choice of either adding an array with a spare or an array without a spare.

This aspect of the invention suffers the limitation that as DASDs fail and are replaced to other arrays, the MTTDL of the system will drop, until the broken DASDs are replaced and the dispersed data copied back.

Spare DASD Distributed Across Multiple Arrays

Referring now to Table 2, the spare blocks of a single spare DASD are shared across multiple arrays. In this regard, the spare is shared across two 2+P arrays. In the following embodiment, the distribution step and means are shown as they pertain to the laying out of parity groups and single DASD's work of spare space across two arrays.

TABLE 2

| 1  | 2  | 3  | 4  | 5  | 6  | 7  | <—DASD |
|----|----|----|----|----|----|----|--------|
| D1 | D1 | P1 | d1 | d1 | p1 | S1 |        |
| D2 | P2 | D2 | d2 | p2 | S2 | d2 |        |
| P3 | D3 | D3 | p3 | S3 | d3 | d3 |        |
| D4 | D4 | P4 | S4 | d4 | d4 | p4 |        |
| D5 | P5 | S5 | D5 | d5 | p5 | d5 |        |
| P6 | S6 | D6 | D6 | p6 | d6 | d6 |        |
| S7 | D7 | D7 | P7 | d7 | d7 | p7 |        |

Data and parity blocks of array 1 are indicated by uppercase Ds and Ps; data and parity blocks of array 2 are indicated by lowercase ds and ps. Note that all the data and parity from array 1 are on DASDs 1, 2, 3 and 4 and that all the data and parity from array 2 are on DASDs 4, 5, 6 and 7. Therefore, the MTTDL of either array is the same as any 2+P array with distributed sparing.

The distribution step operates as follows:

Referring to Tables 2 and 3, S1 is placed on block 1 of DASD 7, S2 on block 2 of DASD 6, and so on. That is, the spares are rotated across the 7 DASDs shown in a uniform way. Next, the blocks of array 1 are stored on DASDs 1, 2 and 3 as:

TABLE 3

| 1 | 2 | 3 | <-DASD |
|---|---|---|---|
| D1 | D1 | P1 | |
| D2 | P2 | D2 | |
| P3 | D3 | D3 | |
| D4 | D4 | P4 | |
| D5 | P5 | D5 | |
| P6 | D6 | D6 | |
| D7 | D7 | P7 | |
| .etc ... | | | |

However, if one of these blocks must be a spare as determined by the spare rotation above, then give priority to the spare and shift any data and parity blocks to the right to accommodate the spare. Thus as expressed in Table 4, the first four rows of the placement of array 1 are unaffected by spares, but the other three rows are affected by spare placement. The result causes array 1's placement to become:

TABLE 4

| 1 | 2 | 3 | 4 | <-DASD |
|---|---|---|---|---|
| D1 | D1 | P1 | | |
| D2 | P2 | D2 | | |
| P3 | D3 | D3 | | |
| D4 | D4 | P4 | | |
| D5 | P5 | S5 | D5 | |
| P6 | S6 | D6 | D6 | |
| S7 | D7 | D7 | P7 | |
| .etc ... | | | | |

Similarly, the data and parity blocks of array 2 are placed on DASDs 4, 5 and 6 except when they need to be shifted to the right to satisfy the placement of a spare or array 1.

The result has each DASD with 4 data blocks, 2 parity blocks and a spare block, so there is uniform distribution of spares and parity across all DASDs in the array.

Groups of Arrays

In the above embodiment, the storage subsystem would expand by adding two 2+P arrays at a time. Relatedly, each two array unit would have the one spare DASDs worth of spare blocks to share between them.

In this embodiment, assume that the storage subsystem has expanded to 14 DASDs (2 array groups of 7 DASDs). Each array group of 7 DASDs has two 2+P arrays and 1 DASD equivalent of distributed spare blocks. Let the arrays in group 1 be array 1 and array 2; let the arrays in group 2 be array 3 and array 4. Consider that a DASD in array 1 fails; then it would be rebuilt to spare space in group 1.

Assume that a DASD in array 2 fails. Even though array 2 is part of group 1, we would allow it to be rebuilt to the spare space in group 2, since no spare space remains in group 1. This dispersal of data from a DASD in a first group to DASDs in other groups results in a decrease in MTTDL of the storage subsystem until the failed DASDs have been replaced and data has been copied back.

Storage System Expansion by Array Multiples

Expansion of a storage subsystem by an array multiples bears resemblance to the previous distribution of groups and spare blocks. For example, suppose two 2+P arrays share a single spare. The subsystem would be initially configured to support a single 2+P+S array. The system would expand by another 2+P array, resulting in a system with two 2+P arrays and a spare distributed amongst them. The layout of data and spares when there is only a single 2+P system is shown in Table 5.

TABLE 5

| 1 | 2 | 3 | 4 | <-DASD |
|---|---|---|---|---|
| D1 | D1 | P1 | S1 | |
| D2 | P2 | D2 | S2 | |
| P3 | D3 | D3 | S3 | |
| D4 | D4 | P4 | S4 | |
| D5 | P5 | S5 | D5 | |
| P6 | S6 | D6 | D6 | |
| S7 | D7 | D7 | P7 | |

As the next 2+P array is added to the same group, Table 6 depicts a distribution which shares the spare between the two 2+P arrays in the group without any data movement:

TABLE 6

| 1 | 2 | 3 | 4 | 5 | 6 | 7 |
|---|---|---|---|---|---|---|
| D1 | D1 | P1 | d1 | d1 | p1 | S1 |
| D2 | P2 | D2 | d2 | p2 | S2 | d2 |
| P3 | D3 | D3 | p3 | S3 | d3 | d3 |
| D4 | D4 | P4 | S4 | d4 | d4 | p4 |
| D5 | P5 | S5 | D5 | d5 | p5 | d5 |
| P6 | S6 | D6 | D6 | p6 | d6 | d6 |
| S7 | D7 | D7 | P7 | d7 | d7 | p7 |

Advantageously, this distribution allows the K block capacity of a single spare DASD to be shared between multiple arrays, but does not require that expansion be in terms of multiple arrays. This avoids oversparing with respect to an ultimate sparing fraction objective.

Extensions

The invention has been described where both the parity blocks and spare DASD capacity have been distributed. One extension is to preserve the parity blocks on a dedicated DASD and distribute just the spare capacity.

Combinations of the aforementioned parity group and sparing distributions could be employed. It is possible to mix the distribution pattern in a multi-group array. That is, the storage subsystem is capable of expansion by adding an array with spare, an array without a spare or multiple arrays with a shared spare between them at different times. The particular patterns used would be a function of the size of the system, the spare replacement policy, and the sparing ratio that is considered acceptable.

These and other extensions of the invention may be made without departing from the spirit and scope thereof as recited in the appended claims.

We claim:

1. In a storage subsystem having a plurality of DASDs, a method for rebuilding portions of parity groups resident on a failed one of said DASDs, each parity group including N data, P parity, and S spare blocks, each DASD storing K blocks, comprising the steps of:

(a) configuring an array of N+P+S DASDs;

(b) distributing K parity groups in synchronous array addresses across subsets of N+P DASDs of the array such that no two blocks from the same parity group reside on the same DASD, each DASD storing data or parity blocks from (K−K*S/N+P+S)) parity groups, and distributing K*S blocks as spare storage across the array such that each DASD includes K*S/(N+P+S) spare blocks thereon; and (c) in the event of a single DASD failure, for each of the K−K*S/(N+P+S) parity groups on the failed DASD, logically combining N+P+S−2 blocks belonging to the group from N+P+S−2 other DASDs into a single block, and, writing said single block into a counterpart one of the remaining K*S*(N+P+S−1)/(N+P+S) spare blocks such that no two blocks of the same parity group are distributed on the same DASD.

2. In a storage subsystem having a plurality of DASDs, a method for rebuilding portions of parity groups resident on a failed one of said DASDs, each parity group including N data and 1 parity blocks, each DASD storing K blocks, comprising the steps of:

(a) configuring an array of N+2 DASDs;

(b) distributing K parity groups in synchronous array addresses across subsets of N+1 DASDs of the array such that no two blocks from the same parity group reside on the same DASD, each DASD storing K−K/(N+2) data or parity blocks, and distributing K blocks as spare storage across the array such that each DASD includes K/(N+2) spare blocks thereon; and (c) in the event of a single DASD failure, for each of the K−K/(N+2) parity groups, logically combining N blocks belonging to the group from N other DASDs into a single block, and, writing said single block into a counterpart one of the remaining K*(N+1)/(N+2) spare blocks such that no two blocks of the same parity group are distributed on the same DASD.

3. The method according to claim 2, wherein each parity group is written into N+1 storage locations, and upon failure of a single DASD and rebuilding of said parity groups, only K−(K/(N+2)) storage locations are rendered unavailable.

4. The method according to claim 2, wherein all array DASDs other than failed DASD are addressable and responsive to access commands whether operated in fault tolerant or degraded modes.

5. The method according to claim 2, wherein the steps of distributing up to K parity groups and K spare storage blocks further comprises the steps of:

distributing said parity groups and spare blocks across N+2 DASDs such that no more than one spare storage block nor more than one parity block are stored on the same synchronous array address or on the same DASD.

6. The method according to claim 2, wherein steps (b) and (c) further comprise the steps of distributing 2*K blocks of spare storage and K*P parity blocks such that no more than two spare storage blocks nor more than P parity blocks are stored on the same synchronous array address or on the same DASD.

7. The method according to claim 2, wherein the parity block from each of the K groups is written to a dedicated one of the N+2 DASDs.

8. The method according to claim 2, wherein each parity group is accessed concurrently from a selective subset of N+1 of the N+2 DASDs.

9. The method according to claim 2, wherein each parity group is accessed non-concurrently from a selective subset of N+1 of the N+2 DASDs.

10. The method according to claim 2, wherein each DASD includes cyclic track storage means of m tracks; and means for moving from track to track and reading or writing data or parity blocks selectively along one or more tracks; and further wherein the method step (c) includes the steps of:

(1) positioning the moving means to a predetermined location on the cyclic track storage means of each of the remaining N+1 DASDs and traversing all m tracks starting from the predetermined location;

(2) at the start of the traverse, logically combining and writing the block lost from the first parity group onto the spare block of (N+2)nd DASD concurrent with a reading operation performed by the remaining N other DASDs;

(3) continuing logically combining and writing the block lost from the second parity group on the spare block of the (N+1)st DASD concurrent with a reading operation performed by the remaining N DASDs; and (4) repeating step (3) until each block stored on the failed DASD from the K−K/(N+2) parity groups is recreated and rewritten into a counterpart spare block across each of the remaining DASDs.

11. A storage subsystem for accessing parity groups of N data blocks and 1 parity block each, comprising:

an array formed from N+2 DASDs, each DASD having the storing K blocks;

first means for distributing N+1 blocks of each of K parity groups across counterpart subsets of N+1 DASDs selected from the array such that no two blocks from the same parity group is stored on the same DASD;

means for distributing K blocks of storage as spare blocks such that each array DASD reserves K/(N+2) blocks thereon;

second means for identifying any single DASD failure; and means responsive to any single DASD failure identified by the seconds means for processing each of up to K−K/(N+2) parity groups by logically combining N blocks belonging to the group from N other DASDs into a single block, and, writing said single block into a counterpart one of the remaining up to K*(N+1)/(N+2) spare blocks such that no two blocks of the same parity group are distributed on the same DASD.

12. The storage subsystem according to claim 11, wherein the K spare blocks are distributed such that no two blocks occupy the same array address and the same DASD.

13. The storage subsystem according to claim 11, wherein upon failure of a single DASD and rebuilding of said parity groups, only K−(K/(N+2)) block storage locations are rendered unavailable for array use.

14. The storage subsystem according to claim 11, wherein the parity block from each of the K−K/(N+2) groups is written to a dedicated one of the N+2 DASDs.

15. The storage subsystem according to claim 11, wherein each DASD includes cyclic track storage means of m tracks; and means for moving from track to track and reading or writing data or parity blocks selectively along one or more tracks; and further wherein the means for logically combining and writing the K parity groups includes:

means for positioning the moving means to a predetermined location on the cyclic track storage means of each of the remaining N+1 DASDs and for traversing all m tracks starting from the predetermined location;

third means at the start of the traverse, for logically combining and for writing the block lost from the first parity group on the spare block of (N+2)nd DASD concurrent with a reading operation performed by the remaining N other DASDs; and fourth means including the third means for continuing logically combining and writing the block lost from the second parity group on the spare block of the (N+1)st DASD concurrent with a reading operation performed by the remaining N DASDs, and for repeating the combining and writing until each block stored on the failed DASD from the K parity groups is recreated and rewritten into a counterpart spare block across the remaining DASDs.

16. A storage subsystem comprising:
an array formed from at least N+P+2 DASDs, each DASD having the capacity to store K blocks;
first means for distributing K parity groups across any N+P DASD subset of the N+P+2 DASDs in synchronous addresses, each parity group consisting of N data blocks+P parity blocks such that no two blocks from the same parity group are stored on the same DASD;
means for reserving and distributing the capacity equivalent of up to 2*K blocks of storage as spare blocks across the array of N+P+2 DASDs such that no more than two spare storage locations nor more than one parity block are stored on the same synchronous address or on the same DASD,
second means for identifying up to any two DASD failures in said array; and
means responsive to identification by said second means of up to any two DASD failures for logically combining the K−2*K/(N+P+2) parity grups from N remaining DASDs into single blocks, and writing the single blocks into the 2*(K−1) blocks of remaining reserved spare storage such that no two portions of the same parity group are distributed on the same DASD.

17. The storage subsystem according to claim 16, wherein said system further comprises means for distributing K*P parity blocks such that not more than one parity block is located at the same synchronous address nor on the same DASD.

18. The storage subsystem according to claim 16, wherein each parity group is accessed concurrently from a selective N DASD subset of the N+2 DASDs.

19. A storage subsystem comprising:
a first and a second failure independent array each formed from at least N+P+1 DASDs, each DASD having the capacity to store K blocks;
first means for distributing K parity groups across N+P+1 DASDs of either the first or second arrays mutually exclusively, each parity group consisting of N data blocks+P parity blocks such that no two blocks from the same parity group are stored on the same DASD;

means for distributing K blocks of storage as spare blocks across N+P+1 DASDs of the first array and K blocks of storage as spare blocks across N+P+1 DASDs of the second array such that in each array only one storage block resides at each synchronous address and on each DASD;
second means for identifying a first or a second DASD failure occurring in either the first or second arrays;
means responsive to any single DASD failure identified by the second means for processing, in the array in which the failure occurred, each of the K−K/(N+P+1) parity groups by logically combining N+P−1 blocks belonging to the group from N+P−1 other DASDs into a single block, and, writing said single block into a counterpart one of the remaining K*(N+P)/(N+P+1) spare blocks such that no two blocks of the same parity group are distributed on the same DASD; and
means responsive to any second DASD failure identified in the same or other array by the second means for processing, in the array having available spare blocks, each of the K−K/(N+2) parity groups by logically combining N+P−1 blocks belonging to the group from N+P−1 other DASDs in the array in which the second failure occurred into a single block, and, writing said single block into a counterpart one of the remaining K*(N+P)/(N+P+1) spare blocks such that no two blocks of the same parity group are distributed on the same DASD.

20. The storage subsystem according to claim 19, wherein the means responsive to said second failure DASD failure maintains the subsystem in a lossless information state only if the second failure occurs after the means responsive to the first failure has rebuilt the parity groups on the failed DASD and written them into counterpart spare blocks.

21. In a storage subsystem comprising a first and a second failure independent array of DASDs, each DASD having the capacity to store K blocks, a method for rebuilding portions of parity groups resident on a failed DASD, each parity group including N data and P parity blocks, comprising the steps of:

(a) configuring a first array of N+P+1 DASDs and a second array of N+P DASDs;

(b) distributing up to K parity groups in synchronous array addresses across subsets of N+P DASDs out of N+P+1 DASDs of the first array and K parity groups across N+P DASDs of the second array such that no two blocks from the same parity group reside on the same DASD, and distributing K blocks as spare storage across the first array such that each DASD includes K/(N+P+1) spare blocks thereon, each synchronous address and DASD having only one spare block thereon;

(c) in the event of a single DASD failure occurring in the first array, for each of the K−K/(N+P+1) parity groups, logically combining N+P−1 blocks belonging to the group from N+P−1 other DASDs into a single block, and, writing said single block into a counterpart one of the remaining K*(N+P)/(N+P+1) spare blocks such that no two blocks of the same parity group are distributed on the same DASD; and (d) in the event of a single DASD failure occurring in the second array, for each of the K parity groups, logically combining the N+P−1 blocks belonging to the group from the N+P−1 other DASDs into a single block, and, writing said single block into a counterpart one of the K spare blocks located on the first array.

22. In a storage subsystem having a plurality of DASDs, a method for rebuilding portions of parity groups resident on a failed one of said DASDs, each parity group including N data and P parity blocks, each DASD storing K blocks, comprising the steps of:

(a) configuring 2*(N+P)+1 DASDs of the plurality to form first and second addressible arrays of N+P DASDs each with one DASD shared by both arrays;

(b) distributing K spare blocks across the 2*(N+P)+1 DASDs such that each synchronous address thereacross and each DASD includes only K/(2*(N+P)+1) blocks, and (1) distributing K parity groups across the first array of DASDs such that no synchronous first array address has more than a single parity block and that each parity group is written into a counterpart first array synchronous address to effectuate block offset or rotation from address to address; and (2) distributing K other parity groups across subsets of N+P DASDs of the N+P+1 DASDs addressibly part of the second array such that no synchronous second array address has more than a single parity block and that each said other parity group is written into a counterpart second array synchronous address to effectuate block offset or rotation from address to address; and (c) in the event of a single DASD failure occurring in either the first or second array, for each of the parity groups in that array, logically combining the remaining blocks belonging to the group from other DASDs in that array into a single block, and, writing said single block into a counterpart one of the remaining spare blocks distributed across both arrays such that no two blocks of the same parity group are distributed on the same DASD.

23. The storage subsystem according to any one of the claims 11, 16, or 19, wherein said first means for distributing parity groups includes means for alternatively distributing parity blocks to only a dedicated one of the DASDs.

24. The method according to any one of the claims 1, 2, or 21, wherein the step of distributing parity groups includes the step for alternatively distributing parity blocks to a dedicated one of the DASDs.

* * * * *

UNITED STATES PATENT AND TRADEMARK OFFICE
CERTIFICATE OF CORRECTION

PATENT NO. : 5,258,984
DATED : Nov. 2, 1993
INVENTOR(S) : Menon et al.

It is certified that error appears in the above-indentified patent and that said Letters Patent is hereby corrected as shown below:

Column 8, line 68, after "it", Insert -- is--.

Column 13, line 7, delete "whole line", insert -- (K-K*S/(N+P+S)) parity groups, and distribut- --.

Column 15, line 46, delete"grups", insert -- groups --.

Signed and Sealed this

Eighteenth Day of April, 1995

Attest:

BRUCE LEHMAN

*Commissioner of Patents and Trademarks*

*Attesting Officer*